United States Patent
Wagner

[19]

[11] Patent Number: 5,982,248
[45] Date of Patent: Nov. 9, 1999

[54] INTEGRATED CIRCUIT REPLACEMENT OPERATING CLOCK SIGNAL GENERATOR HAVING A CRYSTAL OSCILLATOR

[75] Inventor: Wolfgang Wagner, München, Germany

[73] Assignee: Siemens Aktiengesellschaft, Munich, Germany

[21] Appl. No.: 09/182,276

[22] Filed: Oct. 29, 1998

Related U.S. Application Data

[63] Continuation of application No. PCT/DE97/00796, Apr. 21, 1997.

[30] Foreign Application Priority Data

Apr. 29, 1996 [DE] Germany .......................... 196 17 174

[51] Int. Cl.[6] ............................... H03B 5/24; H03B 5/36
[52] U.S. Cl. .............. 331/158; 331/108 B; 331/116 FE; 331/137
[58] Field of Search ........................... 331/108 B, 108 C, 331/116 R, 116 FE, 117 R, 117 FE, 117 D, 135–137, 158

[56] References Cited

U.S. PATENT DOCUMENTS

| | | | |
|---|---|---|---|
| 4,321,562 | 3/1982 | Igarashi | 331/116 FE |
| 4,571,558 | 2/1986 | Gay et al. | 331/105 |
| 5,550,489 | 8/1996 | Raab | 326/93 |
| 5,712,599 | 1/1998 | Kleinberg | 331/108 B |

FOREIGN PATENT DOCUMENTS 0 286 879 A1  10/1988  European Pat. Off. .

OTHER PUBLICATIONS

Patent Abstracts of Japan No. 61–154153 (Takao), dated Jul. 12, 1986.
Patent Abstracts of Japan No. 63–157509 (Michio), dated Jun. 30, 1988.
"Microcomputers Components", Siemens Data Book, 1988, Microcontrollers; p. 78.
"Single–Pin" Integrated Crystal Oscillators (Nordholt et al.), IEE Transactions on Circuits and Systems, vol. 37, No. 2, New York, 1990, pp. 175–182.
"Oscillators" (Kurz), Informative Electronics, pp. 3 and 27–29; Kurz, G.; 1988.

*Primary Examiner*—David Mis
*Attorney, Agent, or Firm*—Herbert L. Lerner; Laurence A. Greenberg

[57] ABSTRACT

An integrated circuit configuration for producing a clock signal includes an integrated inverter connected between an input terminal and an output terminal. A crystal is externally connected to the oscillator circuit. A feedback path of the inverter contains a phase-shifting element which effects a phase shift through 180°, so that conditions for oscillation continue to be provided if the crystal breaks.

3 Claims, 1 Drawing Sheet

INTEGRATED CIRCUIT REPLACEMENT OPERATING CLOCK SIGNAL GENERATOR HAVING A CRYSTAL OSCILLATOR

CROSS-REFERENCE TO RELATED APPLICATION

This application is a continuation of copending International Application No. PCT/DE97/00796, filed Apr. 21, 1997, which designated the United States.

BACKGROUND OF THE INVENTION

Field of the Invention

The invention relates to an integrated circuit configuration having a crystal oscillator for producing an operating clock signal, including a crystal to be connected externally at first and second connection terminals for producing a phase shift of 180°, and an integrated inverter for producing a further phase shift of 180°, thus together effecting an overall phase shift of 360°, the inverter having an input and an output connected to the first and the second connection terminals.

Many integrated circuits, such as microcontrollers, in which a multiplicity of peripheral units are additionally integrated besides a microprocessor, have an oscillator which is suitable for the connection of a crystal. The Siemens data book entitled "Microcomputer Components", Microcontrollers, Data Catalog 1998, page 78, lower left-hand figure, shows how such an oscillator can be connected or wired up externally with a crystal. FIG. 2 of the instant application shows an additional internal circuit section which is described in detail below.

U.S. Pat. No. 4,571,5583 describes a crystal oscillator circuit in which the feedback path of the inverter contains two integrators that together effect a phase shift of 180°. That phase shift through 180° causes the oscillatory response of the oscillator to be less temperature-dependent and to be less dependent on manufacturing tolerances. A further generic circuit configuration having a crystal oscillator is described in U.S. Pat. No. 4,321,562.

With rising performance requirements, microcontrollers are being operated at higher and higher frequencies. The crystal disks therefore have to be made thinner and thinner, which means that the risk of breakage increases. That is particularly relevant in the automotive sector due to vibration, since such microcontrollers are used in that sector for engine control, ABS control or the like. Such crystal breakage causes the oscillator to stop and thus also leads to the failure of the entire system. In order to avoid that, a so-called emergency clock signal is often required, which can be achieved by additional circuit complexity.

Published European Patent Application 0 286 879 A1, corresponding to U.S. Pat. No. 4,816,776, discloses an integrated circuit configuration for monitoring an additionally integrated oscillator, in which an integrated oscillator is excited by an external frequency standard. A second integrated reserve oscillator produces a slower auxiliary clock signal which is constantly compared with the oscillator clock signal, and the system clock signal is then obtained from the faster clock signal. If the crystal fails, for example as a result of it breaking, the system changes over to the reserve oscillator.

A further possibility is using a PLL for producing the system clock signal, in which that PLL has a minimum frequency which depends on the minimum frequency of the voltage-controlled oscillator in the PLL. In the event of the crystal breaking, the frequency of the system clock signal reverts to the minimum frequency of the PLL. A further advantage of a PLL is that the oscillator frequency can be many times lower than that of the system clock signal, which means that crystals which are thicker and therefore less likely to break are used.

The disadvantage of all of those configurations is the relatively large amount of circuitry.

SUMMARY OF THE INVENTION

It is accordingly an object of the invention to provide an integrated circuit configuration having a crystal oscillator, which overcomes the hereinafore-mentioned disadvantages of the heretofore-known devices of this general type, which produces an emergency clock signal in the event of the crystal breaking and which can be produced by using simple circuitry.

With the foregoing and other objects in view there is provided, in accordance with the invention, an integrated circuit configuration having a crystal oscillator for producing an operating clock signal, comprising first and second connection terminals; a crystal to be connected or wired-up externally to the connection terminals for producing a phase shift of 180°; an integrated inverter for producing a further phase shift of 180°, thus effecting an overall phase shift of 360° together smith the crystal, the integrated inverter having an input and an output respectively connected to the first and second connection terminals, and the integrated inverter having a feedback path; and an additionally integrated phase-shifting circuit section connected in the feedback path for effecting a phase shift through 180° and producing an emergency clock signal if the operating clock signal fails.

In accordance with another feature of the invention, the additionally integrated phase-shifting oscillator contains a multiplicity of RC elements dimensioned for effecting a phase shift of 180° in total.

In accordance with a concomitant feature of the invention, the additionally integrated phase-shifting oscillator includes three resistors connected in series with node points therebetween, and capacitors each connected between a respective one of the two node points and a reference-ground potential.

Other features which are considered as characteristic for the invention are set forth in the appended claims.

Although the invention is illustrated and described herein as embodied in an integrated circuit configuration having a crystal oscillator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 2:
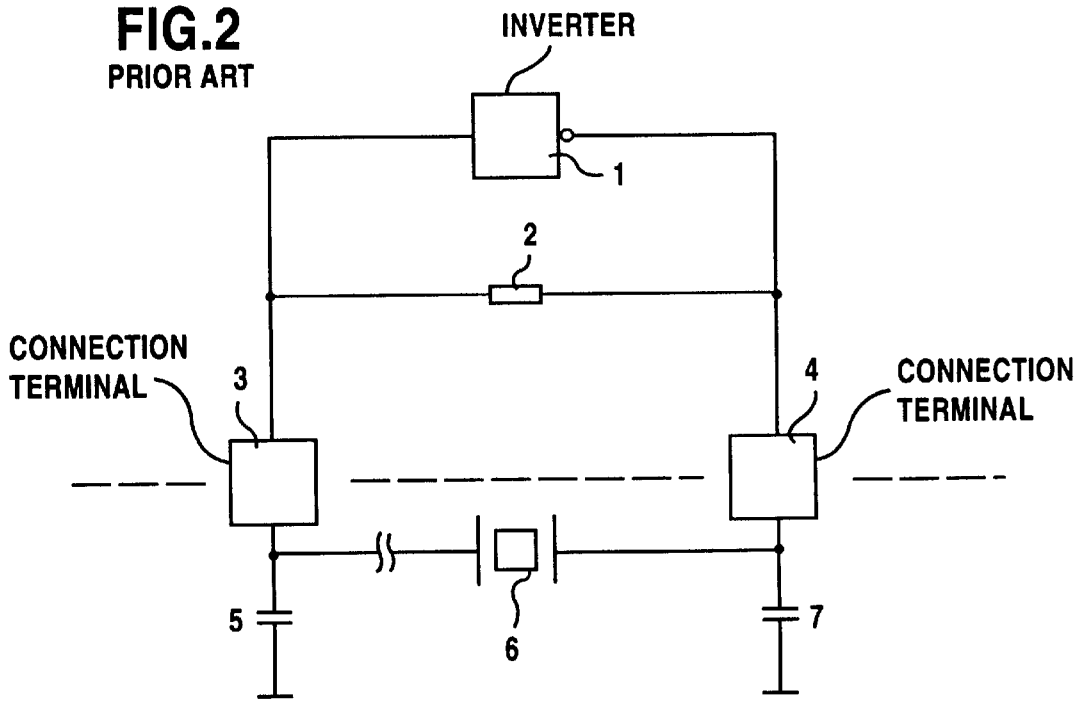
FIG. 2 is a basic schematic and block circuit diagram according to the prior art.

Referring now to the figures of the drawings in detail and first, particularly, to FIG. 2 thereof, there is seen an additional internal circuit section. Reference numeral 1 denotes an inverter which is connected between connection terminals 3 and 4. A resistor 2 is connected in parallel with the inverter 1. These two elements 1, 2 are additionally integrated in a microcontroller. An integrated section of the circuit is in a top half of the figure and is separated from an external section in c bottom half of the figure by a dashed line. A crystal 6 is connected externally between the connection terminals 3 and 4, and capacitors 5 and 7 are respectively connected between the connection terminal 3 and ground and between the connection terminal 4 and ground.

The principle of the present invention is that a feedback path of the inverter contains a phase-shifting component or circuit section which effects a phase shift through 180°. This allows the integrated oscillator to continue to oscillate easily.

Figure 1:
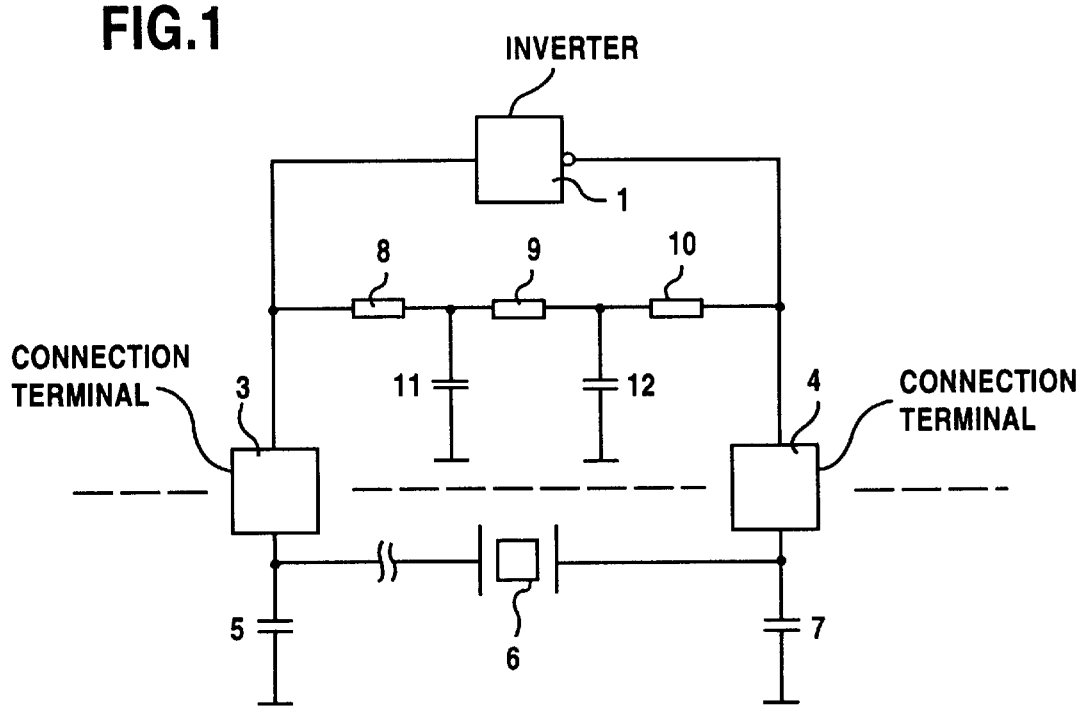
FIG. 1 is a basic schematic and block circuit diagram for a circuit configuration according to the invention.

Therefore, in the configuration shown in FIG. 1, the resistor 2 shown in FIG. 2 has been replaced by a series circuit including three resistors 8, 9 and 10 which are connected between the input terminals 3 and 4. A node point between the resistor 8 and the resistor 9 is connected to a first connection of a capacitor 11, having a second connection which is connected to ground. Similarly, a node point between the resistors 9 and 10 is connected to a first connection of a further capacitor 12, having a second connection which is also connected to ground.

The oscillator circuit shown in FIG. 1 or FIG. 2 is a typical oscillator circuit which usually includes an inverter and a feedback element, for example a resistor or very high-impedance transistors in the region of 100 kΩ to 1 MΩ. Externally, only a crystal 6 and the two capacitors 5 and 7 are necessary.

In FIG. 1, a break shown in the line connecting the crystal 6 to the connection terminal 3 represents the crystal being broken, for example. The break means that, in a customary configuration as is shown in FIG. 2, the conditions for oscillation are no longer provided. However, a phase shift through 180° takes place by inserting the elements 8 to 12 in the feedback path of the inverter 1, with the result that the oscillation can start again. However, the initial frequency is then significantly different than that which is normally produced, and this can be recognized by the microcontroller, so that appropriate emergency measures can be taken. In this configuration, the RC elements 8 to 12 represent the simplest type of phase shifting. Since an individual RC element 8, 11 or 9, 12 only produces a shift through 90°, this means that at least two RC elements are needed. In order to achieve this, in the present case, the original resistor 2 is subdivided into three resistor components 8, 9, 10, and the capacitors 11 and 12 are respectively connected between them.

In this manner, the continued oscillation of the oscillator at an "emergency frequency" can be ensured by using only two additional integrated capacitors, and therefore a replacement clock signal is provided in this way in the event of the crystal breaking.

I claim:

1. In an integrated circuit configuration having a crystal oscillator for producing an operating clock signal, the improvement comprising:

first and second connect-on terminals;

a crystal to be connected externally to said connection terminals for producing a phase shift of 180°;

an integrated inverter for producing a further phase shift of 180°, thus effecting an overall phase shift of 360° together with said crystal, said integrated inverter having an input and an output respectively connected to said first and second connection terminals, and said integrated inverter having a feedback path; and an additionally integrated phase-shifting circuit section connected in said feedback path for effecting a phase shift through 180° and producing an emergency clock signal if the operating clock signal fails.

2. The integrated circuit configuration according to claim 1, wherein said additionally integrated phase-shifting oscillator contains a multiplicity of RC elements dimensioned for effecting a phase shift of 180° in total.

3. The integrated circuit configuration according to claim 1, wherein said additionally integrated phase-shifting oscillator includes three resistors connected in series with node points therebetween, and capacitors each connected between a respective one of said two node points and a reference-ground potential.

\* \* \* \* \*